(12) United States Patent
Bibes et al.

(10) Patent No.: US 9,312,471 B2
(45) Date of Patent: Apr. 12, 2016

(54) METHOD OF IMPLEMENTING A FERROELECTRIC TUNNEL JUNCTION, DEVICE COMPRISING A FERROELECTRIC TUNNEL JUNCTION AND USE OF SUCH A DEVICE

(75) Inventors: Manuel Bibes, Paris (FR); Vincent Garcia, Paris (FR); Agnès Barthelemy, Janvry (FR); Karim Bouzehouane, Janvry (FR); Stéphane Fusil, La Ville du Bois (FR)

(73) Assignees: THALES, Neuilly-sur-Seine (FR); UNIVERSITE PARIS-SUD, Orsay (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 14/008,330
(22) PCT Filed: Apr. 2, 2012
(86) PCT No.: PCT/EP2012/055970
§ 371 (c)(1),
(2), (4) Date: Mar. 11, 2014
(87) PCT Pub. No.: WO2012/131093
PCT Pub. Date: Oct. 4, 2012

(65) Prior Publication Data
US 2014/0169061 A1 Jun. 19, 2014

(30) Foreign Application Priority Data
Mar. 31, 2011 (FR) ..................................... 11 00967

(51) Int. Cl.
*G11C 11/22* (2006.01)
*H01L 43/02* (2006.01)
*H01L 27/088* (2006.01)
(52) U.S. Cl.
CPC ............... *H01L 43/02* (2013.01); *G11C 11/22* (2013.01); *G11C 11/2275* (2013.01); *H01L 27/088* (2013.01)

(58) Field of Classification Search
CPC ...... G11C 11/22; G11C 20/021; G11C 11/223
USPC .......................................................... 365/145
See application file for complete search history.

(56) References Cited

U.S. PATENT DOCUMENTS 5,541,422 A 7/1996 Wolf et al.
5,751,625 A * 5/1998 Mihara .......................... 365/145
(Continued)

OTHER PUBLICATIONS

Search Report and Written Opinion issued in App. No. PCT/EP2012/055970 (2012).
(Continued)

*Primary Examiner* — Anthan Tran
(74) *Attorney, Agent, or Firm* — Knobbe Martens Olson & Bear, LLP

(57) ABSTRACT

The invention relates to a method of implementing a ferroelectric tunnel junction, said junction comprising to films each forming an electrode-type conductive element, and separated by a film forming a ferroelectric element acting as the tunnel barrier, said ferroelectric element being able to possess a remanent polarization. According to the invention, the ferroelectric element possesses a domain structure, said domains corresponding to regions of the ferroelectric element the polarization of which is oriented one way in a single direction; and when a voltage is applied between the electrodes, the absolute value of the voltage being equal to or higher than the absolute value of what is called a saturation voltage, the ferroelectric element main comprises only a single domain; and when a voltage is applied between the electrodes, the absolute value of the voltage being lower than the absolute value of what is called the saturation voltage, the ferroelectric element comprises a plurality of separate domains, the spatial distribution of said domains and their proportions being controlled by the chosen voltage value.

9 Claims, 1 Drawing Sheet

(56) References Cited

U.S. PATENT DOCUMENTS

| | | | |
|---|---|---|---|
| 7,283,382 B2 * | 10/2007 | Windlass et al. | 365/145 |
| 7,759,713 B2 | 7/2010 | Kalinin et al. | |
| 8,098,520 B2 * | 1/2012 | Seigler et al. | 365/173 |
| 2001/0052607 A1 * | 12/2001 | Kato et al. | 257/295 |
| 2002/0122328 A1 * | 9/2002 | Oowaki et al. | 365/145 |
| 2003/0112650 A1 | 6/2003 | Kang | |
| 2006/0145225 A1 | 7/2006 | Kohlstedt et al. | |

OTHER PUBLICATIONS

Esaki, L. et al., Jan. 1971, "Polar Switch", IBM Technical Disclosure Bulletin, vol. 13, No. 8., p. 2161.

* cited by examiner

METHOD OF IMPLEMENTING A FERROELECTRIC TUNNEL JUNCTION, DEVICE COMPRISING A FERROELECTRIC TUNNEL JUNCTION AND USE OF SUCH A DEVICE

The present invention relates to a method of implementing a ferroelectric tunnel junction, said junction belonging to the field of thin film heterostructures that may in particular be used as component elements of a non-volatile random-access memory.

In current microelectronic devices, the non-volatile storage of information is primarily provided by magnetic hard disks and non-volatile random access memories (NVRAM).

Thus, in these devices, the information is encoded in binary form, such that the memories store "0" and "1", and is processed by transistors in ON or OFF states.

Magnetic hard disks have the advantage of being inexpensive. However, they are slow and fragile.

The NVRAM market is dominated by Flash memories. Flash memories have very long write times (approximately a millisecond) and limited endurance (approximately $10^5$ cycles). NVRAM may also be phase change memories (PCRAM) or magnetic non-volatile random access memories (MRAM). These memories have an increased endurance and shorter read time, but their write consumption is currently too high to allow them to replace Flash memories on a large scale.

None of the different current NVRAM appear satisfactory in light of the aforementioned drawbacks.

In order to resolve the aforementioned problems, devices with two electric terminals have been proposed having an electro-resistance effect, for example with a base of $TiO_2$.

However, the different resistance states correspond to different spatial distributions of ions, atoms, or defects such as oxygen vacancies. Their operation is therefore based on the electro-migration effect of ions or atoms, which involves high operating temperatures, potential fragility of the devices, and a poorly controlled operating speed, since it is related to the mobility of the ions or atoms.

As mentioned above, the information storage technologies are far from optimal, and depending on the technology used, have long write times and/or limited endurance and/or high write consumption and/or limited robustness.

Furthermore, although these systems currently operate using a binary logic, many studies are considering processing information in analog form in the future.

New developments have therefore occurred, including a non-volatile memory device based on a ferroelectric tunnel junction, made up of an assembly consisting of two films, each forming an electrode-type conductive element and separated by a fine film consisting of a ferroelectric insulator acting as a tunnel barrier.

Thus, below the Curie temperature of the ferroelectric barrier, it is possible to induce a macroscopic remanent polarization in the ferroelectric element, the polarization being able to be oriented in both senses in a single direction, the polarization senses depending on the sign of the voltage applied between the electrodes.

According to the direction of the ferroelectric polarization, the tunnel current through the ferroelectric barrier has different values, which is commonly called "tunnel electro-resistance effect". The behavior of the ferroelectric tunnel junction may be described by the ratio of the tunnel resistances corresponding to different polarizations, for example opposite polarizations, or a so-called "OFF-ON" ratio.

Theoretically, the ratio of the tunnel resistances may reach values of from 100 to 1000, or even more.

Furthermore, these values are reproducible from one device to the next, for thousands of write cycles.

The ferroelectric tunnel junction concept, called "polar switch", was described in 1971 by L. Esaki et al [IBM Techn. Disclos. Bull. 13, 2161 (1971)]. Likewise, such devices are described in patents U.S. Pat. No. 5,541,422, US2006/0145225A1 and U.S. Pat. No. 7,759,713.

Non-volatile memory devices based on ferroelectric tunnel junctions, as described above, use the macroscopic direction of the ferroelectric polarization in the tunnel barrier to store the information.

These devices have the drawback of only encoding binary information or, in certain cases, discrete information, but not analog information.

The invention aims to propose a method for implementing a ferroelectric tunnel junction making it possible to write the information on a storage device in binary form or in analog form.

To that end, the invention relates to a method of implementing a ferroelectric tunnel junction, said junction comprising two films each forming an electrode-type conductive element, and separated by a film forming a ferroelectric element acting as the tunnel barrier, said ferroelectric element being able to possess a remanent polarization, characterized in that the ferroelectric element possesses a domain structure, said domains corresponding to regions of the ferroelectric element the polarization of which is oriented one way in a single direction, and in that:

when a voltage is applied between the electrodes, the absolute value of the voltage being equal to or higher than the absolute value of what is called a saturation voltage, the ferroelectric element mainly comprises only a single domain, when a voltage is applied between the electrodes, the absolute value of the voltage being lower than the absolute value of what is called the saturation voltage, the ferroelectric element comprises a plurality of separate domains, the spatial distribution of said domains and their proportions being controlled by the chosen voltage value.

The method according to the invention may include one or more of the following features:
the film forming a ferroelectric element may have a thickness comprised between 0.1 and 10 nm;
the film forming a ferroelectric element may generate a positive or negative potential barrier going from 50 milli-electronvolts to several electronvolts relative to the Fermi level of the films each forming a conductive element;
the films each forming a conductive element may have a thickness comprised between 0.5 and 200 nm;
applying a voltage between the electrodes may make it possible to store information in said ferroelectric tunnel junction, the stored information being read by applying a read voltage whereof the absolute value is lower than the absolute value of the voltage having made it possible to store the information in said junction;
when a voltage is applied between the electrodes, whereof the absolute value is equal to or greater than the absolute value of what is called the saturation voltage, the ferroelectric element mainly comprises only a single domain, such that the ferroelectric element has only one main domain or one set of main domains corresponding to more than 50% of the surface of the barrier, and preferably more than 80% of the surface of the barrier, and still more preferably more than 95% of the surface of the barrier.

The invention also relates to a device comprising a ferroelectric tunnel junction, said junction comprising two films each forming an electrode-type conductive element and separated by a film forming a ferroelectric element acting as the tunnel barrier, characterized in that said tunnel junction is implemented using a method according to the invention.

The invention also relates to the use of a device according to the invention, in an analog non-volatile memory in which the information is written by applying a voltage or a series of variable voltages, with an absolute value lower than the absolute value of the saturation voltage.

The invention also relates to the use of a device according to the invention, in a binary non-volatile memory in which the information is written by applying a voltage with an absolute value equal to or greater than the absolute value of the saturation voltage.

The invention also relates to the use of a device according to the invention, in a logic circuit element or in a microswitch, controllable by applying a voltage with an absolute value equal to or greater than the absolute value of the saturation voltage.

The invention also relates to the use of a device according to the invention, in a non-volatile variable resistance connector in which the information is written by applying a voltage.

The invention will be better understood upon reading the following description, provided solely as an example and done in reference to the appended drawings, in which.

Figure 1:
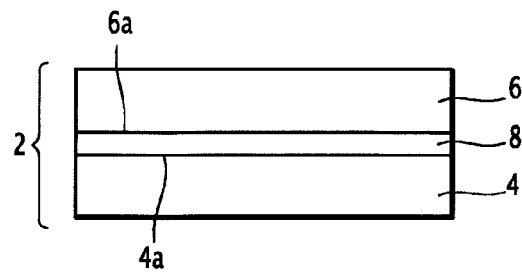
FIG. 1 is a transverse cross-sectional view of a ferroelectric tunnel junction.

The device shown in FIG. 1 includes an assembly 2 made up of two thin films 4 and 6 each forming an electrode-type conductive element, so as to respectively form a "lower electrode" and an "upper electrode", said films 4 and 6 being separated by a thin film 8 formed by a ferroelectric material forming a ferroelectric element.

The ferroelectric film 8 may be made up of a polymer-type organic material, such as croconic acid, PVDF (polyvinylidene fluoride), PVPS (polyvinylidene difluoride) or their copolymers; an inorganic material with a perovskite structure, such as $(Ba,Sr)TiO_3$, $Pb(Zr,Ti)O_3$, $Bi(Fe,Mn)O_3$, $Sr_{0.8}Bi_{2.2}Ta_2O_9$ called "SBT", $SrBi_2Nb_2O_9$ called "SBN", etc., these materials optionally being able to be subjected to a tensile or compressive biaxial strain; or a binary oxide, such as BaO or SrO, subjected to a tensile or compressive biaxial strain, this list not being exhaustive.

Preferably, the ferroelectric film 8 may have a thickness comprised between 0.1 and 10 nm.

Preferably, the ferroelectric film 8 may generate a positive or negative potential barrier going from 50 milli-electronvolts (meV) to several electronvolts (eV) relative to the Fermi level of the upper and lower electrodes formed by the thin films 4 and 6, the height of the potential barrier in particular being related to the nature of the ferroelectric film 8 and the electronic structure of the material making it up.

The upper and lower electrodes, formed by the thin films 4 and 6, may be made non-exhaustively using the following materials: $SrRuO_3$, $(La,Sr)MnO_3$, $CaRuO_3$, $SrVO_3$, $(La,Sr)CoO_3$, $LaNiO_3$, ITO (indium tin oxide), Pt or its alloys, Pd or its alloys Ir or its oxides ($IrO_x$) or its alloys, Ru or its oxides ($RuO_x$) or its alloys.

The upper and lower electrodes may be made up of the same material, or alternatively, different materials.

Preferably, the thin films 4 and 6 may have a thickness comprised between 0.5 and 200 nm.

Preferably, the upper surface 4a of the lower electrode 4 and the lower surface 6a of the upper electrode 6, between which the ferroelectric film 8 extends, extend in parallel.

Traditionally, the device shown in FIG. 1 may be developed using one or more combined growth techniques, such as pulsed laser ablation, cathode spraying, CVD, evaporation, molecular jet epitaxy, or other methods.

The device of FIG. 1 constitutes a heterostructure of thin films in which the ferroelectric film 8 is used as "tunnel barrier", said film 8 being positioned between the two conductive films 4 and 6 used as electrodes. This heterostructure is, in a known manner, called "ferroelectric tunnel junction".

As will be described later, during the implementation of the tunnel junction according to the inventive method, the tunnel barrier formed for the ferroelectric film 8 has a domain structure, the domains corresponding to regions of the film in which the polarization is oriented one way in a single direction.

Subsequently, we consider only the value of the projection of the polarization, which, depending on the case, extends in a direction normal to the upper surface 4a of the lower electrode 4 or in a direction normal to the lower surface 6a of the upper electrode 6.

As will be seen hereinafter, the domain structure is controlled by the electrical voltage applied to the electrodes.

As shown in FIGS. 2 to 5, the invention proposes to use the domain structure of the tunnel barrier. The illustrated hysteresis cycles show the polarization P as a function of the voltage V applied between the electrodes for a given ferroelectric barrier, each curve in thick lines describing the variation of the polarization as a function of the applied voltage, the domain structure associated with the polarization state reached after each voltage application being diagrammatically shown in the bottom right of each Figure. The illustration in thin lines corresponds to the saturated cycle.

The illustration of the domain configuration has been chosen to assume the simple case where the polarization is oriented in two opposite senses of a same direction, the polarized regions being shown in white or black in these diagrams, depending on the sense of the polarization.

As will be seen, two operating modes of the tunnel junction may be considered.

Figure 2:
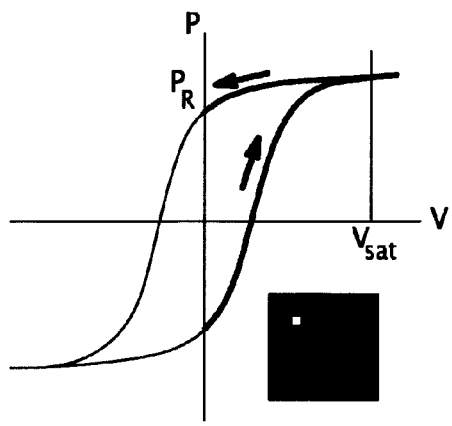
FIGS. 2 to 5 show different hysteresis cycles representing the behavior of the polarization of a ferroelectric material based on an applied voltage, each hysteresis cycle being associated with a diagrammatic top view illustration of the configuration in domains showing the polarization in the ferroelectric element.
Figure 3:
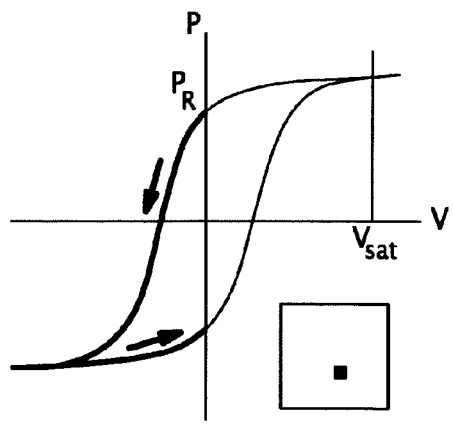

A first "binary" operating mode is shown in FIGS. 2 and 3. In this embodiment, the tunnel barrier has only one domain or mainly only one domain, such that the tunnel barrier has only one main domain or one set of main domains corresponding to more than 50% of the surface of the barrier, and preferably more than 80% of the surface of the barrier, and still more preferably more than 95% of the surface of the barrier.

This means that by applying a voltage equal to or greater than a saturation voltage called $V_{sat}$, the remanent polarization is maximal and primarily oriented in a direction normal to the upper surface 4a of the lower electrode 4 or the lower surface 6a of the upper electrode 6. This maximum remanent polarization is denoted Pr in the Figures.

The sense of this polarization is determined by the sign of the selected voltage.

In FIG. 2, the evolution of the ferroelectric polarization is shown during the application of a positive voltage equal to or greater than the saturation voltage $V_{sat}$.

Likewise, FIG. 3 shows the evolution of the ferroelectric polarization during the application of a negative voltage whereof the absolute value is equal to or greater than the absolute value of the saturation voltage $V_{sat}$.

Thus, the states shown in FIGS. 2 and 3 correspond to what are called quasi-saturated states whereof the polarization extends, for each one, in opposite senses. Such states correspond to different logic states called "ON" and "OFF" types.

Figure 4:
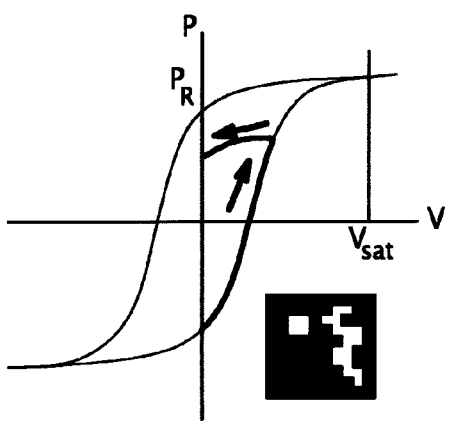
Figure 5:
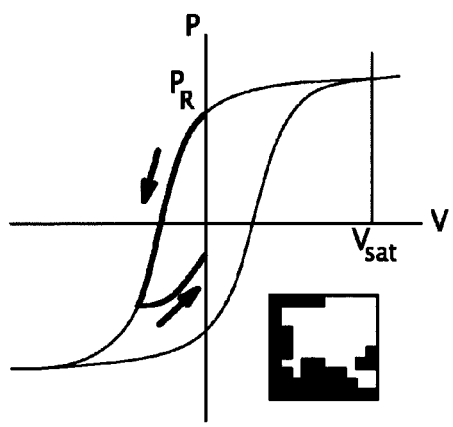

A second "analog" operating mode is shown in FIGS. 4 and 5. In this mode, the tunnel barrier has several domains randomly distributed in the ferroelectric film 8, such that part of the domains has a remanent polarization oriented in a direction normal to the upper surface 4a of the lower electrode 4 and the other part of the domains has a remanent polarization oriented in a direction normal to the lower surface 6a of the upper electrode 6. In the illustrated case, these two directions are identical, but the senses of the two polarizations must be opposite.

This operating mode is obtained by applying, in absolute value, a voltage lower than that of the saturation voltage $V_{sat}$. A multitude of configurations of the domain structure is then possible, the distribution of the domains and their proportions depending on the selected voltage value.

In FIG. 4, the evolution of the ferroelectric polarization is shown during the application of a positive voltage lower than the saturation voltage $V_{sat}$.

Likewise, FIG. 5 shows the evolution of the ferroelectric polarization during application of a negative voltage, the absolute value of which is lower than that of the saturation voltage $V_{sat}$.

It will be noted that the use of a thin ferroelectric film generally makes it possible to obtain an inclined and non-square hysteresis cycle like that obtained during the use of a thicker film. This type of cycle makes it possible, irrespective of the applied voltage, to stabilize the intermediate polarization states of the domain structure.

It will subsequently be allowed that the different domains of the structure conduct the current in parallel. Thus, the resistance of the ferroelectric tunnel junction depends on the size and relative domain proportion and the polarization in the domain. Thus, it is possible to obtain a resistance of the ferroelectric tunnel junction whereof the value evolves continuously.

Stopping the voltage applied to the electrodes makes it possible to obtain stabilization of the chosen domain structure, the domain structure and therefore the resistance evolving when a new voltage with a different value is applied.

The present invention proposes to use the domain structure of the ferroelectric film 8 making up the tunnel barrier to allow a binary or analog operation.

Thus, owing to the inventive method, the ferroelectric tunnel junction may be used in particular as a non-volatile memory element using the macroscopic direction of the ferroelectric polarization in the tunnel barrier to store information.

When binary operation is desired, a voltage, the absolute value of which is greater than or equal to that of the saturation voltage $V_{sat}$, is applied such that the tunnel barrier has only a single domain or mainly only a single domain, such that the tunnel barrier has only one main domain or one set of main domains, the remanent polarization then being maximal and clearly oriented in a direction normal to the surfaces 4a or 6a of the electrodes.

When analog operation is desired, one or more so-called "intermediate" voltages, i.e., whereof the absolute value is lower than that of the saturation voltage $V_{sat}$, is (are) applied. The spatial distribution of the domains and the relative proportions, in which the polarization points toward one or the other of the electrodes, then depend on the chosen voltage value(s).

When one wishes to read the information contained in the non-volatile memory elements, said information being written as previously mentioned, a read voltage much lower than the write voltage is applied so as not to destroy the stored information. The read device then recovers the value of the resistance depending on the domain structure previously created.

The invention also makes it possible to organize the ferroelectric tunnel junctions in two-dimensional or three-dimensional matrices so as in particular to produce high-capacity binary or analog memory elements, or networks of non-volatile variable resistance connectors.

The behavior of the ferroelectric tunnel junction may be defined by the maximum ratio of the resistances obtained in read mode, each resistance being obtained for a different polarization direction. Preferably, this maximum ratio is obtained for identical polarization directions and opposite polarization senses; this ratio is also called "OFF-ON" ratio.

Promising laboratory tests have shown "OFF-ON" ratios greater than 100. These tests have proven reproducible on dozens of devices and thousands of write cycles.

By analogy with the performance of random-access ferroelectric memories FeRAM, very high operating frequencies, in the vicinity of a gigahertz, are expected, with an endurance greater than $10^{14}$ cycles and a write energy lower than $10^{-14}$ J/bit once the components are optimized.

Unlike the methods of implementing tunnel junctions of the prior art, whereof the modulation of the height of the tunnel barrier depends solely on the ferroelectric polarization, the method used according to the invention considers several other physical mechanisms for controlling the electroresistance effect.

Thus, the value of the resistance of a domain is related to the direction and sense of polarization and the amplitude of the ferroelectric polarization. These properties in particular influence the thickness and height of the tunnel barrier formed by the ferroelectric film 8.

Likewise, these properties depend on the state density at the interface present between the tunnel barrier and the lower electrode 4 and the state density at the interface present between the tunnel barrier and the upper electrode 6, as well as the symmetry of the electronic wave functions participating in the tunnel current and the coupling of the electronic wave functions participating in the tunnel current with the electronic wave functions present in the electrodes.

Many industrial applications of the method according to the invention may be considered in which the tunnel junction is electrically controlled, such as producing a binary non-volatile memory element in which the information is written by applying a positive or negative voltage, the absolute values of the voltages applied during writing being equal to or greater than the absolute value of the saturation voltage.

Also, the tunnel junction may be used as an analog non-volatile memory element in which the information is written by applying a voltage or a variable voltage series, positive or negative, with an absolute value lower than the absolute value of the saturation voltage.

In these examples, during reading of the information, the resistance is measured with an applied voltage much lower than the write voltage.

Also, the tunnel junction may be used as a logic circuit element or as a microswitch, controllable by applying a positive or negative voltage, the absolute values of the voltages applied being equal to or greater than the absolute value of the saturation voltage.

Also, the tunnel junction may be used as a non-volatile variable resistance connector in which the information is written by applying a variable voltage, which may be positive or negative.

The invention claimed is:

1. A device comprising:
a ferroelectric tunnel junction, the junction comprising two films, each one of the films forming an electrode-type conductive element, separated by a ferroelectric film, the ferroelectric film having a thickness comprised between 0.1 and 10 nm to form a ferroelectric element acting as a tunnel barrier, wherein said ferroelectric film possessing a remnant polarization,
wherein the ferroelectric film possesses a ferroelectric domain structure comprising ferroelectric domains corresponding to regions in the ferroelectric element where the polarization is oriented in the same sense and the same direction,
and wherein a value of the resistance of the ferroelectric tunnel junction depends on a ferroelectric domain structure of the ferroelectric film;
a source of voltage configured to apply a writing voltage between the two films to store a piece of information in said ferroelectric tunnel junction by creating a ferroelectric domain structure in the ferroelectric film; and
said source of voltage further configured to read, in a non-destructive manner, the piece of information stored in the ferroelectric tunnel junction by applying a reading voltage whose absolute value is lower than the absolute value of the writing voltage, so as to generate a tunnel current through the ferroelectric tunnel junction, wherein (1) the value of the resistance is recovered based on the ratio of the value of the reading voltage to the value of the tunnel current, and (2) the value of the resistance depending on the ferroelectric domain structure previously created.

2. The device according to claim 1, wherein the film forming a ferroelectric element constitutes a positive or negative potential barrier going from 50 milli-electronvolts to several electronvolts relative to the Fermi level of the films each forming an electrode-type conductive element.

3. The device according to claim 1, wherein the films each forming an electrode-type conductive element may have a thickness comprised between 0.5 and 200 nm.

4. The device according to claim 1, wherein when an absolute value of the voltage applied is equal to or greater than the absolute value of what is called the saturation voltage, the ferroelectric element mainly comprises only one single domain, such that the ferroelectric element has only one main domain or one set of main domains corresponding to more than 50% of a surface of the barrier, and preferably more than 80% of the surface of the barrier, and still more preferably more than 95% of the surface of the barrier.

5. The device according to claim 1, wherein the source of voltage is configured to apply the reading voltage at a constant voltage.

6. A method of writing reading a piece of information in a ferroelectric tunnel junction, said junction comprising two films, each of the films forming an electrode-type conductive element, separated by a ferroelectric film, the ferroelectric film having a thickness comprised between 0.1 and 10 nm to form a ferroelectric element acting as a tunnel barrier, said ferroelectric film being able to possess a remnant polarization, wherein the ferroelectric film possesses a ferroelectric domain structure comprising ferroelectric domains corresponding to regions in the ferroelectric element where the polarization is oriented in the same sense and the same direction, a value of a resistance of the ferroelectric tunnel junction depending on a ferroelectric domain structure of the ferroelectric film, said method comprising:
storing a piece of information in the ferroelectric tunnel junction by applying a writing voltage between the films adapted to store said piece of information in said ferroelectric tunnel junction b creating a ferroelectric domain structure in the ferroelectric film; and
reading, in a non-destructive manner, the piece of information stored in the ferroelectric tunnel junction, by applying a reading voltage whose absolute value is lower than the absolute value of the writin volta e, so as to generate a tunnel current through the ferroelectric barrier, wherein (1) the value of the resistance being recovered based on a ratio of the value of the reading voltage to the value of the tunnel current, and (2) the value of the resistance depending on the ferroelectric domain structure previously created.

7. The method according to claim 6, wherein
when an absolute value of the writing voltage is equal to or higher than an absolute value of what is called a saturation voltage, the ferroelectric element mainly comprises only one single domain; and
when an absolute value of the writing voltage is lower than the absolute value of what is called the saturation voltage, the ferroelectric element comprises a plurality of distinct domains, a spatial distribution of said domains and proportions thereof being controlled b a chosen value of the writing voltage.

8. The method according to claim 6, wherein when an absolute value of the writing voltage is equal to or higher than an absolute value of what is called the saturation voltage, the ferroelectric element mainly comprises only one single domain, such that the ferroelectric element has only one main domain or one set of main domains corresponding to more than 50% of a surface of the barrier, and preferably more than 80% of the surface of the barrier, and still more preferably more than 95% of the surface of the barrier.

9. The method according to claim 6, wherein the reading voltage is constant during the reading step.

* * * * *